United States Patent [19]

La Fiandra

[11] Patent Number: 4,610,020

[45] Date of Patent: * Sep. 2, 1986

[54] X-RAY MASK RING AND APPARATUS FOR MAKING SAME

[75] Inventor: Carlo La Fiandra, New Canaan, Conn.

[73] Assignee: The Perkin-Elmer Corporation, Norwalk, Conn.

[ * ] Notice: The portion of the term of this patent subsequent to Aug. 6, 2002 has been disclaimed.

[21] Appl. No.: 568,778

[22] Filed: Jan. 6, 1984

[51] Int. Cl.$^4$ .............................................. G21K 5/00
[52] U.S. Cl. ...................... 378/35; 269/309; 350/318; 250/491.1
[58] Field of Search ........................... 378/34, 35, 205; 250/491.1; 430/5; 269/309–310; 350/318

[56] References Cited

U.S. PATENT DOCUMENTS

| | | | |
|---|---|---|---|
| 3,743,842 | 7/1973 | Smith et al. ............... | 378/35 |
| 3,892,973 | 7/1975 | Coquin et al. ............. | 378/34 |
| 4,037,111 | 7/1977 | Coquin et al. ............. | 378/35 |
| 4,085,329 | 4/1978 | McCoy et al. .............. | 378/34 |
| 4,185,202 | 1/1980 | Dean et al. ............... | 378/34 |
| 4,187,431 | 2/1980 | Hundt ..................... | 378/34 |
| 4,215,192 | 7/1980 | Buckley ................... | 378/34 |
| 4,238,682 | 12/1980 | Vratny ................... | 378/34 |
| 4,301,237 | 11/1981 | Burns ..................... | 378/34 |
| 4,335,313 | 1/1982 | Kreuzer et al. ............ | 378/34 |
| 4,390,172 | 6/1983 | Gotman ................... | 269/309 |
| 4,534,047 | 8/1985 | Deschenaux et al. ........ | 378/35 |
| 4,539,695 | 9/1985 | La Fiandra ............... | 378/34 |

Primary Examiner—Craig E. Church
Assistant Examiner—Charles Wieland
Attorney, Agent, or Firm—Edwin T. Grimes; Thomas P. Murphy; Richard C. Wilder

[57] ABSTRACT

The present invention is directed to a new and improved X-ray mask ring assembly and apparatus for making same which includes a mask ring, a plurality of kinematic mounts for removably mounting the mask on an alignment cartridge, each of the kinematic mounts including an insert member having a funnel-like shaped seat for receiving a mating ball-like shaped member mounted on the alignment cartridge, and an adhesive for mounting the insert member on the mask ring. An apparatus for making the mask ring assembly includes a fixture having an upper portion and a lower portion, which are adapted to be coupled together in close alignment one with respect to the other, a ball-like shaped member fixedly mounted on the lower portion, a mask ring having an opening for receiving an insert and said insert having a funnel-like shaped seat, the mask ring being mounted in the fixture so that the ball-like shaped member engages the seat, said mask ring being aligned with the fixture and held with respect thereto, and adhesive being applied to fixedly attach the insert member to the mask ring in its aligned position with respect thereto.

9 Claims, 6 Drawing Figures

X-RAY MASK RING AND APPARATUS FOR MAKING SAME

FIELD OF INVENTION

This invention is directed to lithographic systems and, more particularly to an X-ray mask ring and apparatus for making same. X-ray mask ring assemblies constructed according to the concept of the present invention are particularly adapted, among other possible uses, for use in replicating integrated circuit patterns.

This application is closely related to U.S. patent application Ser. No. 568,775 now U.S. Pat. No. 4,539,695, entitled "X-ray Lithography System", and U.S. patent application Ser. No. 568,776, now U.S. Pat. No. 4,534,047, entitled "A Mask Ring Assembly For X-ray Lithography, and U.S. patent application Ser. No. 568,777, entitled "X-ray Anode Assembly"; said applications being filed on even date herewith. All of said applications are assigned to the same assignee. The disclosures contained in said applications are incorporated herein by reference.

BACKGROUND OF INVENTION

X-ray lithography is a proximity patterning technique. A gold pattern X-ray mask is used to selectively absorb and transmit soft X-rays for exposing a resist-coated wafer held in close proximity to the mask. The X-ray mask itself comprises a thin substrate of BN, SiC or Ti that is supported by a rigid mounting ring. The gold mask absorber pattern is formed by etching a 7000 angstrum thick, gold film deposited on the substrate or by a special, low stress, gold plating process.

Soft 7 angstrum X-rays are generated by a high-power source, a water-cooled rotating anode and an electron gun located together in a vacuum chamber. X-rays are generated by focusing the hollow, cone-shaped beam of electrons onto the rotating tungsten surface of the anode. The cylindrical, high-powered electron gun allows the X-rays generated in a small diameter spot to pass through it. This diverging cone of X-ray radiation then passes through a thin beryllium vacuum window into a helium filled exposure chamber. The mask and wafer are closely aligned prior to insertion into the exposure chamber, and maintained during exposure.

The present invention is particularly directed to a new and improved X-ray mask ring assembly and apparatus for making same, which is significantly less complicated, less costly, and achieves a superior product with respect to such assemblies and apparatus employed heretofore.

Related patents in this field include, inter alia; U.S. Pat. Nos. 3,743,842 issued July 3, 1973; 3,892,973 issued July 1, 1975; 4,037,111 issued July 19, 1977; 4,085,329 issued Apr. 18, 1978; 4,185,202 issued Jan. 22, 1980; 4,187,431 issued Feb. 5, 1980; 4,215,192 issued July 29, 1980; 4,238,682 issued Dec. 9, 1980; 4,301,237 issued Nov. 17, 1981 and 4,335,313 issued Jan. 15, 1982.

SUMMARY OF THE INVENTION

Briefly, this application is directed to a mask ring assembly for X-ray lithography which includes a mask ring, a plurality of kinematic mounts for removably mounting said mask ring on an alignment cartridge, each of the kinematic mounts including an insert member which has a funnel-like shaped seat for receiving a mating ball-like shaped member. In addition, the combination includes adhesive means for mounting the insert members on the mask ring in accurate alignment therewith, and wherein the ball-like shaped members are mounted on the alignment cartridge.

In one form of the invention there is provided an apparatus for making a mask ring assembly for X-ray lithography, which includes a fixture having an upper portion and a lower portion, means for removably coupling the two portions together and for aligning them with respect to each other when coupled. The apparatus further includes a ball-like shaped member fixedly mounted on the lower portion, a mask ring having an opening for receiving an insert, said insert having a funnel-like shaped seat, means for mounting the mask ring on the fixture so that the ball-like shaped member engages the seat, means for aligning the mask ring with respect to the fixture, and means for holding the mask ring with respect to said fixture. Further, the apparatus includes means for applying an adhesive to fixedly secure the insert to the mask ring in its aligned position with respect thereto.

There has thus been outlined rather broadly the more important features of the invention in order that the detailed description thereof that follows may be better understood, and in order that the present contribution to the art may be better appreciated. There are, of course, additional features of the invention which will be described hereinafter and which will form the subject of claims appended hereto. Those skilled in the art will appreciate that the conception upon which the disclosure is based may readily be utilized as a basis for the designing of other systems and apparatus for carrying out the several purposes of the invention. It is important, therefore, that the claims be regarded as including such equivalent systems and apparatus as do not depart from the spirit and scope of the invention.

DETAILED DESCRIPTION OF THE PRESENTLY PREFERRED EMBODIMENTS

Figure 1:
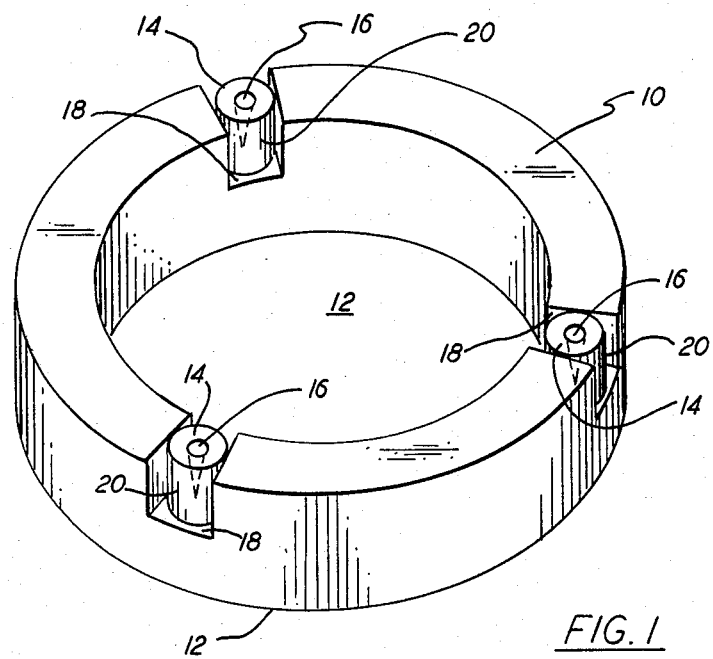
FIG. 1 is a perspective view of an X-ray mask ring assembly constructed according to the concepts of the present invention.

As seen in FIG. 1, an X-ray mask ring assembly includes a round ring 10 on which a mask membrane 12 is stretched. The X-ray mask ring assembly interfaces with an X-ray system by means of three kinematic mounts. Each of the kinematic mounts includes an insert member 14 having a funnel-like shaped seat 16, the insert member being mounted in slots 18 in the ring 10 by adhesive or bonding means 20. The funnel-like shaped seats 16 could be, for example, cone shaped or spherically shaped. The three seats 16 sit on three radially compliant mating ball-like shaped members in the X-ray cartridge and are held down with a vacuum drawn at this interface. Said ball-like shaped members could, for example, be spherically shaped. The radial compliance of the balls forms a true kinematic mount and gives minimum distortion of the ring. However, a problem occurs if the conically-shaped seats are positioned at the wrong spots, because the vacuum is still trying to pull the ring down and therefore the radial flexures move. Since for every force there is an equal and opposite reaction, this produces a reactive force on the ring, thereby distorting the ring. To preclude significant stresses, and the accompanying strains resulting in performance degrading mask distortion the position of the three conical seats in the mask ring must be held to very tight mechanical tolerances such as, for example, 0.0002 inches from the true position. This is particularly difficult to achieve when the ring is fabricated from glass. It requires a generation of three 60° conical seats, all of true geometry and positioned around the ring to 20 arc seconds of true position and a radius of + or −0.0005 inches. According to the present invention three insert members 14 are used, which are installed using a precise fixture, as will be discussed more fully hereinafter.

Figure 2:
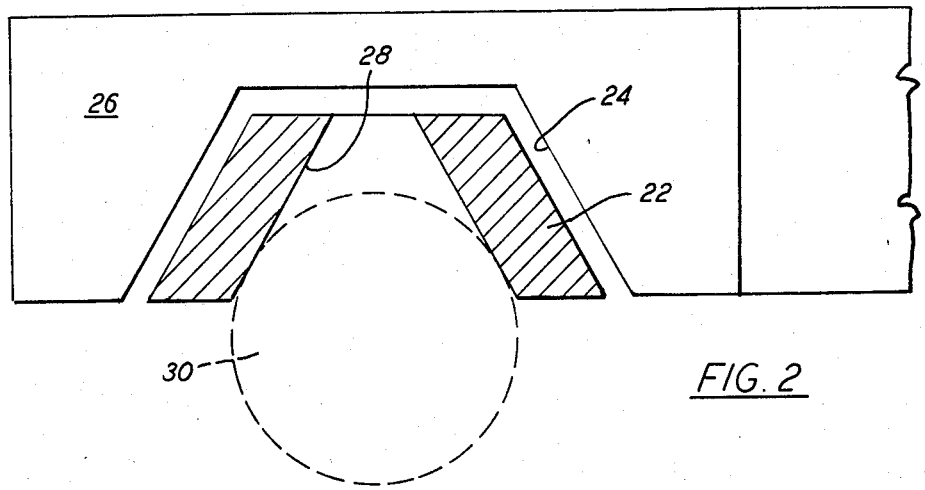
FIG. 2 is an enlarged medial, vertical sectional view of one form of kinematic mount.

FIGS. 2-5 show various insert member configurations. In FIG. 2, a conical insert member 22 is mounted in a conical bore 24 in the mask ring 26. The insert has a funnel-like shaped seat such as, for example, a conically or spherically shaped bore or seat 28 for receiving a ball-like shaped member 30, which may be spherical, for example, as illustrated by a broken line.

Figure 3:
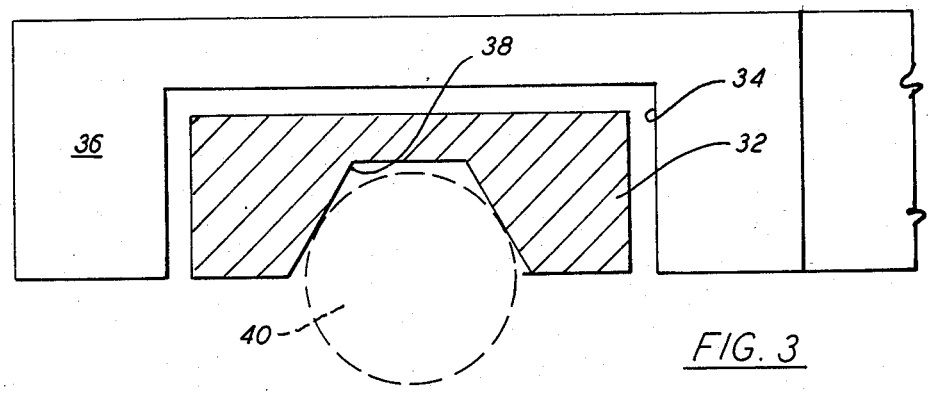
FIGS. 3-5 are similar to FIG. 2, but they show three additional forms of kinematic mounts.

In the embodiment of FIG. 3, a cylindrical insert member 32 is mounted in a cylindrical bore 34 in a mask ring 36. The insert has a funnel-like shaped seat such as, for example a conically or spherically shaped bore or seat 38 for receiving a ball-like shaped member 40 which may be spherically shaped, for example, as indicated by a broken line.

Figure 4:
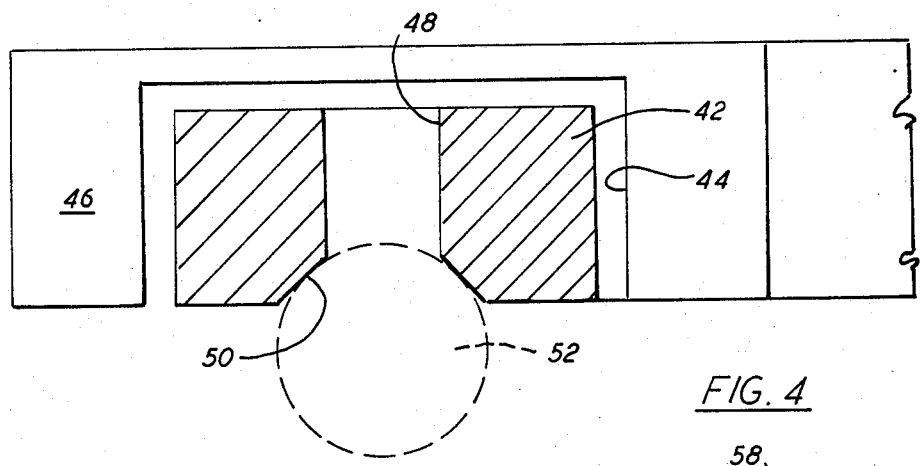

Referring to FIG. 4, a cylindrical insert member 42 is mounted in a cylindrical bore 44 in a mask ring 46. The insert has a straight, through bore 48 with a bevel or chamfer 50 forming a funnel-like shaped seat such as, for example, a conically or spherically shaped seat for receiving a ball-like shaped member 52, which may be spherically shaped, for example, as depicted as a broken line.

Figure 5:
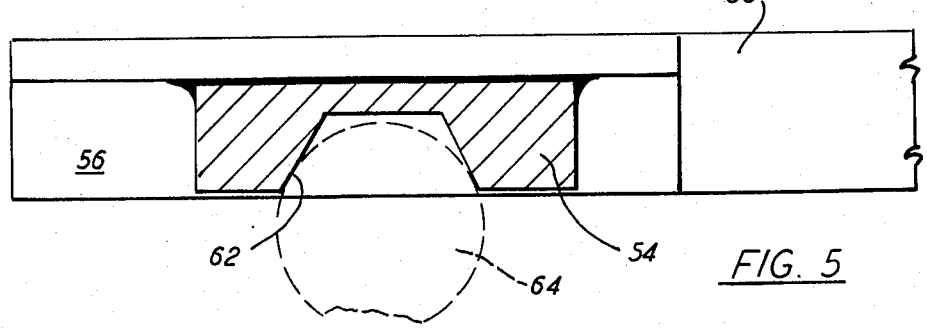

FIG. 5 illustrates the presently preferred embodiment wherein a cylindrically shaped insert 54 is mounted in a radial slot 56 in a mask ring 58. The insert has a bevel or chamfer 62 forming a funnel-like shaped seat such as, for example, a conically or spherically shaped seat for receiving a ball-like shaped member 64, which may be spherically shaped, for example, as indicated by a broken line.

Figure 6:
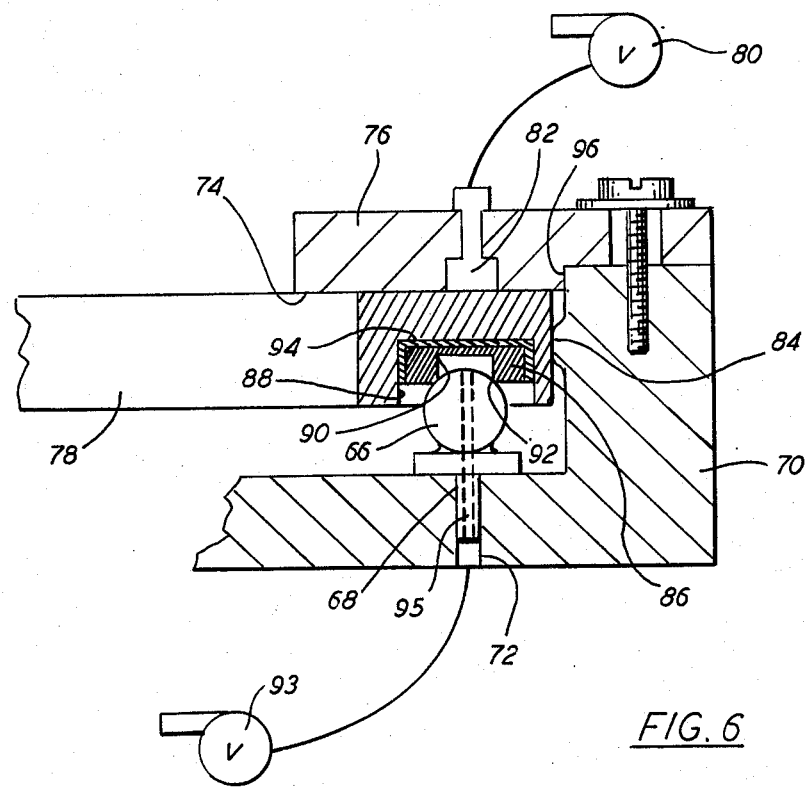
FIG. 6 is a medial, vertical, sectional view showing a portion of an X-ray mask ring assembly mounted on apparatus for fabricating the same.

For purposes of accurately positioning the insert member with respect to the mask ring, a precise fixture is used which aligns and holds the insert while it is being bonded or adhered to the ring. Referring to FIG. 6, a ball-like shaped member 66 is fixedly mounted on a pin 68, which is fixedly mounted on the lower portion 70 of a fixture by means of a force fit in a bore 72. The ball 66 is very accurately positioned with respect to a surface 74 of the upper portion 76 of the fixture and with respect to a surface 84. A mask ring 78 is seated against the surface 74 by clamp means. This same surface of the mask ring is used for alignment purposes during other stages of the lithographic process, thereby providing continuity of reference positions. Any suitable clamping means may be employed such as a vacuum clamp, for example. A source of vacuum 80 is connected to an aperture 82 in the upper portion 76 adjacent the mask ring 78, thereby pulling the mask tightly up against the fixture.

Not only does the mask ring 78 engage the reference surface 74, but it also engages a second external reference surface 84. This is illustrated as a dimple or projection from the lower portion 70 of the fixture. In some installations this reference surface could be in the form of a pin. Actually, it is presently preferred to use two right circular machine pins, one pin sitting in a notch or slot in the ring and the other pin resting against the outside diameter of the ring. It is noted that the surface 74 of the ring and the slot on the outside diameter are used for alignment reference in mask image forming machines such as, for example, E-beam machines.

Still referring to FIG. 6, a metal insert member 86 is set in a radial slot 88 in the mask ring 78. The insert has a straight bore 90 and a bevel or chamfer 92, which forms a funnel-like shaped or conical seat for the ball-like shaped member 66. This member positions the insert 86 with respect to the mask ring 78, which is being positioned by the reference surfaces 74 and 84 so that the insert member is now in correct orientation and true position. A source of vacuum 93 is connected via a passageway 95 to the bore 90, thereby pulling the insert member 86 tightly against the ball 66. Then the insert is fixedly attached or adhered to the mask ring by a suitable bonding agent 94, such as, for example an epoxy. When the bonding agent or epoxy has cured the upper portion 76 is lifted off and the completed mask ring with the inserts is removed. It is noted that the upper portion 76 and the lower portion 70 are referenced with respect to each other by means of a pilot diameter, as indicated at 96. Actually, these two portions mate on three spaced pads only, so that they are positioned very accurately with respect to each other. The pilot diameter determines the radial alignment and a pin, not shown, controls the rotational positioning.

It will thus be seen that the present invention does indeed provide a new and improved X-ray mask ring assembly and apparatus for making same, which is of simple construction and which minimizes mask distortions, and repeatably positions the elements very accurately with respect to each other.

Although specific embodiments have been illustrated and described, it will be obvious to those skilled in the art that various modifications may be made without departing from the spirit and scope of the invention, which is to be limited solely by the appended claims.

What is claimed is:

1. A mask ring assembly for X-ray lithography comprising:
   a mask ring;
   a plurality of kinematic mounts for removably mounting said mask ring on an alignment cartridge;
   each of said kinematic mounts including an insert member having a funnel-like shaped seat for receiving a mating ball-like shaped member mounted on said alignment cartridge; and
   adhesive means for mounting said insert member on said mask ring.

2. A mask ring assembly according to claim 1 wherein said plurality of kinematic mounts comprises at least three kinematic mounts.

3. A mask ring assembly according to claims 1 wherein said plurality of kinematic mounts comprises three kinematic mounts spaced about 120° apart from each other.

4. A mask ring assembly according to claim 2 wherein said insert member is of cylindrical configuration.

5. A mask ring assembly according to claim 4 wherein said mask ring has a radially extending slot for receiving said cylindrically-shaped member.

6. A mask ring assembly according to claim 4 wherein said mask ring has a mating cylindrically-shaped bore for receiving said cylindrically shaped insert member.

7. A mask ring assembly according to claim 2 wherein said insert member is of conical configuration.

8. A mask ring assembly according to claim 7 wherein said mask ring has a mating conically shaped bore for receiving said conically shaped insert member.

9. A mask ring assembly according to claim 1 wherein said funnel-like shaped seat is a cone-shaped seat and said mating ball-like shaped member is a spherical member.

* * * * *